United States Patent [19]

Logan et al.

[11] 4,136,928

[45] Jan. 30, 1979

[54] OPTICAL INTEGRATED CIRCUIT INCLUDING JUNCTION LASER WITH OBLIQUE MIRROR

[75] Inventors: Ralph A. Logan, Morristown; James L. Merz, Madison, both of N.J.

[73] Assignee: Bell Telephone Laboratories, Incorporated, Murray Hill, N.J.

[21] Appl. No.: 794,465

[22] Filed: May 6, 1977

[51] Int. Cl.² .................... G02B 5/14; H01S 3/19
[52] U.S. Cl. .................... 350/96.11; 331/94.5 H; 357/19
[58] Field of Search ............ 350/96.11, 96.12; 331/94.5 C, 94.5 D, 94.5 F, 94.5 H; 357/17, 18, 19, 20, 30

[56] References Cited

U.S. PATENT DOCUMENTS

| 3,978,426 | 8/1976 | Logan et al. | 350/96.11 X |
| 3,996,528 | 12/1976 | Blum et al. | 331/94.5 H |
| 4,002,997 | 1/1977 | Thompson | 331/94.5 H |
| 4,007,978 | 2/1977 | Holton | 350/96.11 |

OTHER PUBLICATIONS

Tien et al., "Two-Layered Construction of Integrated Optical Circuits . . . ," *Applied Physics Letters*, vol. 24, No. 11, Jun. 1, 1974.

Suematsu et al., *IEEE (JQE)*, vol. QE-11, No. 7, Jul. 1975, pp. 457-460.
Reinhart et al., *ApL*, vol. 27, No. 1, Jul. 1, 1975, pp. 45-47.
Hurwitz et al., *ApL*, vol. 27, No. 4, Aug. 15, 1975, pp. 241-243.
Aiki et al., *ApL*, vol. 29, No. 8, Oct. 15, 1976, pp. 506-508.
Wang, *IEEE (JQE)*, vol. QE-13, No. 4, Apr. 1977, pp. 176-186.
Campbell et al., *IEEE (JQE)*, vol. QE-13, No. 4, Apr. 1977, pp. 253-255.

*Primary Examiner*—John K. Corbin
*Assistant Examiner*—John D. Lee
*Attorney, Agent, or Firm*—Michael J. Urbano

[57] ABSTRACT

An optical integrated circuit includes a double heterostructure (DH) junction laser and a DH detector formed on an underlying dielectric waveguide. Coupling from the laser to the waveguide and then into the detector is achieved by means of oblique crystal facets formed at the extremities of the laser and detector active regions by a two-step etching process. In the laser the oblique surfaces also provide sufficient optical feedback to define the laser resonator.

11 Claims, 1 Drawing Figure

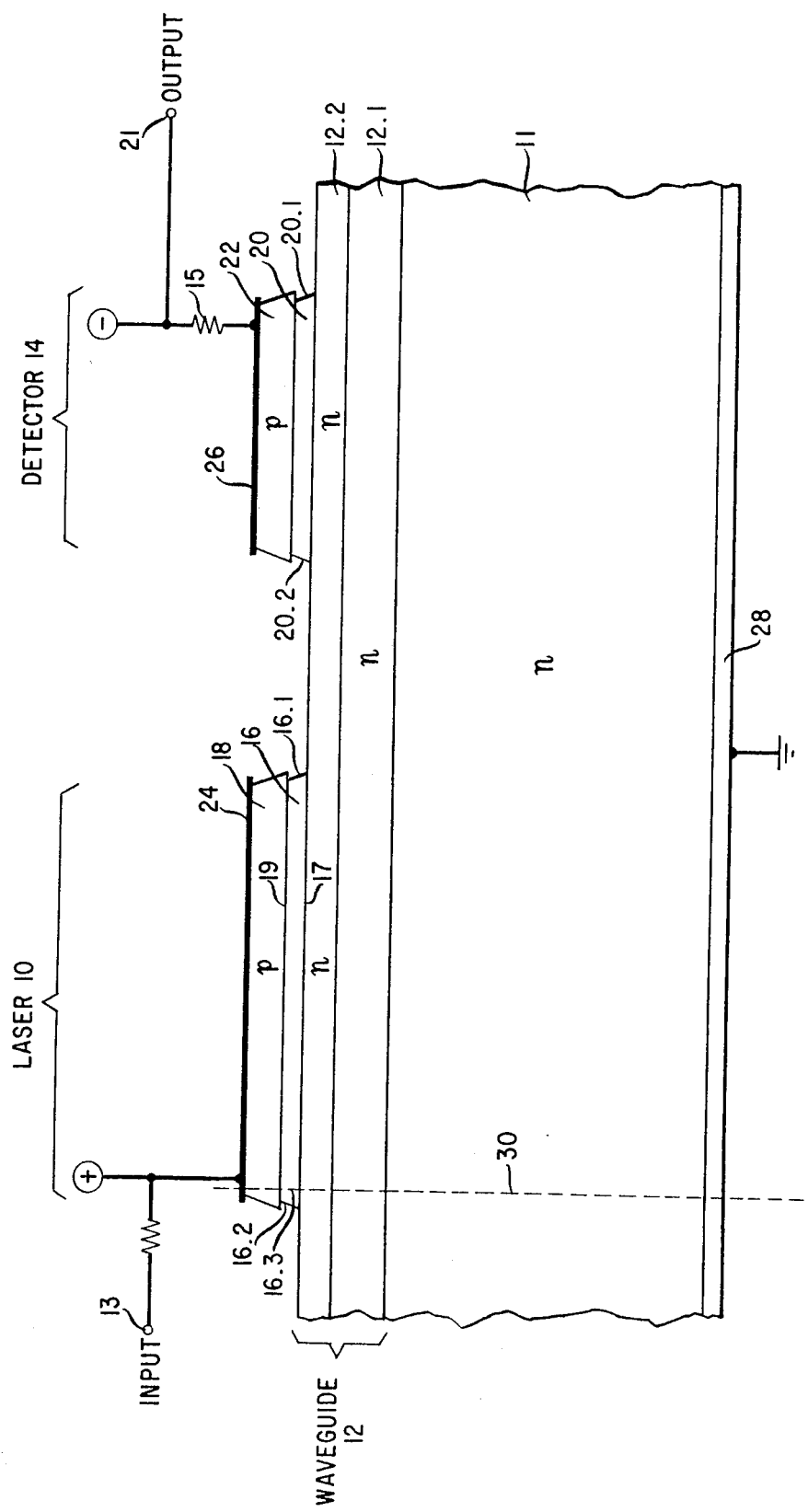

OPTICAL INTEGRATED CIRCUIT INCLUDING JUNCTION LASER WITH OBLIQUE MIRROR

BACKGROUND OF THE INVENTION

This invention relates to optical integrated semiconductor circuits.

Despite intensive efforts in recent years in the fields of optical communications and integrated optics, very few examples of monolithic integration of semiconductor optical devices have been achieved thus far; usually the laser cavity is formed by a pair of parallel cleaved facets, so that the laser source becomes a discrete device incapable of monolithic integration with other circuit components. To overcome this restriction much attention has been devoted to the use of gratings to produce the optical feedback required for integrated devices, [e.g., F. K. Reinhart et al., *Applied Physics Letters*, Vol. 27, p 45 (1975)], but attempts to couple light from an optical cavity defined by these gratings into a low-loss passive waveguide have been accomplished with low efficiencies, typically less than one percent [see also, K. Aiki et al., *Appl. Phys. Let.* Vol. 29, p. 506 (1976)]. An alternative approach to the fabrication of integrated lasers utilizes vertical mirrors made by etching or sputtering. C. E. Hurwitz et al., *Appl. Phys. Let.*, Vol. 27, p. 241 (1975), coupled light from an etched Fabry-Perot cavity laterally into a thick (12 $\mu$m) waveguide with a differential quantum efficiency of about 3.5%. Y. Suematsu et al., *IEEE J. Quant. Electr.*, Vol. QE-11, p. 457 (1975), utilized phase coupling to transfer light from etched or sputtered resonators into a passive waveguide, but data on efficiencies are not given in that work.

SUMMARY OF THE INVENTION

It is an object of our invention to couple laser radiation from a junction laser into an integrated passive waveguide more efficiently than has heretofore been accomplished.

It is another object of our invention to couple radiation from a waveguide into an integrated detector more efficiently than has heretofore been accomplished.

These and other objects are accomplished in accordance with an illustrative embodiment of our invention, an optical integrated circuit comprising a junction laser having an optical resonator and an active region disposed along the longitudinal axis of the resonator, and a dielectric waveguide contiguous with the active region, characterized in that at least one end of the resonator includes a surface which is oblique to the resonator axis and which terminates at least one end of the active region, the surface being effective both to provide optical feedback to the laser and to couple laser radiation from the active region into the waveguide.

In a specific exemplary embodiment, our optical integrated semiconductor circuit comprises a wide bandgap first cladding layer of one conductivity type, a narrower bandgap passive waveguide layer of the same conductivity type contiguous and substantially coextensive with the first cladding layer, a still narrower bandgap laser active region disposed on and optically coupled to a localized portion of the waveguide layer, means forming an optical resonator at opposite extremities of the active region so that the resonator axis extends essentially parallel to the waveguide layer, and a wide bandgap second cladding layer of the opposite conductivity type disposed on the active layer, characterized in that the resonator forming means includes on at least one of the extremities of the active region a surface oriented obliquely to the resonator axis and effective both to provide substantial optical feedback to the active region and to couple a substantial portion of the laser radiation into the waveguide layer.

In a preferred embodiment the laser is of the double heterostructure (DH) GaAs-AlGaAs type, the oblique surface is a ($1\bar{1}1$) crystal facet and the layers are (100) crystal planes. In addition, although both extremities of the active region can be oblique surfaces, coupling of higher power into the waveguide has been achieved when one is oblique and the other is a crystal facet cleaved perpendicular to the resonator axis.

In another aspect of our invention a reverse biased detector is integrated into the circuit by forming both a narrow bandgap detector active region on and optically coupled to another localized portion of the waveguide layer and a wide bandgap third cladding layer of the opposite conductivity type on the detector region. The extremities of the detector region are a pair of oblique crystal facets which enable radiation in the waveguide layer to be coupled into the detector region which generates an electrical signal representative of the radiation intensity. Reverse biasing the detector improves its speed of response, a feature particularly useful in high data rate systems.

From a process standpoint, both types of optical integrated circuits, laser-waveguide and laser-waveguide-detector, are preferably fabricated by epitaxial growth on a (100)-oriented Group III-V substrate (e.g., GaAs). The laser active region and the detector region, and the second and third cladding layers, are initially single layers which are subjected to a two-step etching procedure (stop-etch followed by preferential etch) which bifurcates the single layers into a separate laser and detector both located on the waveguide layer.

BRIEF DESCRIPTION OF THE DRAWING

These and other objects of our invention, together with its various features and advantages, can be readily understood from the following more detailed description taken in conjunction with the accompanying drawing in which the sole FIGURE is a schematic side view of an optical integrated circuit including a DH junction laser optically coupled to an underlying waveguide layer which in turn is coupled to an integrated detector.

DETAILED DESCRIPTION

Structure

With reference now to the FIGURE, there is shown a junction laser 10 optically coupled to an underlying dielectric waveguide 12 which in turn is optically coupled to a reverse biased optical detector 14. Laser 10 and detector 14 are located in spaced relation to one another on the same major surface of waveguide 12.

In greater detail, the laser, waveguide and detector form an optical integrated circuit supported on a semiconductor body or substrate 11. The circuit comprises a wide bandgap first cladding layer 12.1 of one conductivity type and a narrower bandgap passive waveguide layer 12.2 of the same conductivity type contiguous and essentially coextensive with cladding layer 12.1. Laser 10 is formed by a narrower bandgap laser active region 16 located on and optically coupled to a localized portion of waveguide layer 12.2 in combination with a wide bandgap second cladding layer 18 of the opposite conductivity type contiguous with active region 16. In a similar fashion, detector 14 is formed by a narrower bandgap detector region 20 located on and optically coupled to a separate localized portion of waveguide layer 12.2 in combination with a wide bandgap third cladding layer 22 of the opposite conductivity type contiguous with detector region 20. The conductivity type of active region 16 or detector region 20 may be either n-type, p-type, or compensated.

Electrodes 24, 26 and 28 are formed on second cladding layer 18, third cladding layer 22 and substrate 11, respectively.

As will be discussed hereinafter, regions 16 and 20, and layers 18 and 22, are initially single connected layers but are bifurcated by a two-step etching process which forms oblique surfaces at the extremities of layers 16 and 20. Thus, active region 16 is terminated by oblique surfaces 16.1 and 16.2 which serve dual functions: to form an optical resonator which provides optical feedback to the active region and to form a coupler which transfers a substantial portion of the laser radiation into waveguide layer 12.2. On the other hand, detector region 20 is terminated by oblique surfaces 20.1 and 20.2 which serve to couple radiation from waveguide layer 12.2 into detector region 20. In one embodiment layers 16 are (100)-oriented Group III(a)-V(a) compound materials so that the oblique surfaces are (111) planes, e.g., surface 16.1 is a ($1\bar{1}1$) plane whereas surface 16.2 is a ($\bar{1}11$) plane. In this configuration, oblique surfaces 16.1-16.2 are mirror images of one another about a plane perpendicular to the resonator axis. In a similar fashion, oblique surfaces 20.1-20.2 are mirror images of one another.

Preferably, laser 10 and detector 14 are both of the DH type and the various layers of the circuit are binary, ternary or quaternary compounds of Group III(a)-V(a) materials chosen so that adjacent layers can be lattice matched, especially those adjacent the active region 16. For example, layers 12.1, 12.2, active region 16 (or detector region 20) and cladding layer 18 (or cladding layer 22) typically comprise $Al_xGa_{1-x}As$, $Al_yGa_{1-y}As$, $Al_zGa_{1-z}As$, and $Al_rGa_{1-r}As$, respectively, with $z<x,y,r$; $0<x,y,r$; $x>y$; $0\leq z\lesssim 0.4$ (the direct-indirect cross-over) for operation in the wavelength range of about 0.8-0.9 μm. Illustratively, $x=0.3$, $y=0.05$, $z=0$ and $r=0.6$. An $Al_yGa_{1-y}As_{1-q}P_q$ active region with small amounts of P ($q\lesssim 0.03$) operates in the same range. At longer wavelengths of about 1.0-1.3 μm GaAsSb can be used as the active region with AlGaAsSb cladding layers, or InGaAsP can be used as the active region with InP cladding layers.

For CW operation at room temperature the laser is typically thermally coupled to a suitable heat sink (not shown) by means well known in the art, and the active region 16 is less than about 1 μm thick (preferably about 0.15-0.30 μm thick).

In accordance with such operation, suitable voltage sources are connected to electrodes 24, 26 and 28 so that DH laser 10 is forward biased and pumped with current above threshold whereas DH detector 14 is reverse biased so that typically its depletion region is essentially coextensive with the thickness of detector region 20. In an actual communication system, laser 10 would typically be pulse code modulated, i.e., turned on and off, by suitable electronic circuitry (not shown) in accordance with information to be transmitted. Such circuitry would apply electrical pulses to input terminal 13. Whether operated in a PCM mode or not, however, forward biasing laser 10 causes minority carriers to be injected into active region 16 where they are confined by heterojunctions 17 and 19. These carriers undergo electron-hole recombination to produce stimulated radiation which is also partially confined by the same heterojunctions. Notwithstanding that surfaces 16.1-16.2 at the extremities of active region 16 are oblique, we have found that they still supply sufficient optical feedback to effect lasing. That is, the laser resonator is formed by oblique surfaces 16.1-16.2 in conjunction with heterojunctions 17-19. In addition, oblique surfaces 16.1-16.2 serve to couple a substantial portion of the laser radiation into waveguide layer 12.2. To this end, the refractive index step at heterojunction 17 is made sufficiently small that such coupling is made possible yet sufficiently large that carrier confinement in active region 16 is adequate for operation at room temperature. An approximate range of refractive index steps from 0.05 to 0.23, corresponding to $0.05 \leq y < 0.3$ with $z=0$, is suitable for this purpose.

Once in the waveguide layer 12.2, the radiation propagates downstream toward detector 14 where oblique surfaces 20.1-20.2 serve to couple a substantial portion of the radiation into detector region 20. The radiation creates electron hole pairs which produce a photocurrent representative of information being transmitted. The photocurrent is converted by resistor 15, for example, to a voltage at output terminal 21.

Although a pair of oblique surfaces are utilized in laser 10 in the foregoing embodiment of our optical integrated circuit, enhanced coupling efficiency from laser 10 to detector 14 is achieved by replacing oblique surface 16.2 with a surface perpendicular to the resonator axis, e.g., a (110) facet formed by cleaving along plane 30. This configuration points out the trade-off between laser gain, which is enhanced by perpendicular surfaces, and coupling into waveguide 12 which is enhanced by oblique surfaces.

Moreover, that the downstream oblique surface 20.1 of detector 14 is oblique is not critical because essentially all of the radiation is absorbed over the length of the detector region 20. Thus coupling into region 20 is effected primarily by upstream oblique surface 20.2. Finally, in addition to or in lieu of detector 14 a heterostructure modulator can be formed in a similar fashion on waveguide layer 12.2.

Fabrication

Using conventional liquid phase epitaxy techniques (LPE, ramp-cooling) and boat-slider apparatus, we fabricated a GaAs-AlGaAs embodiment of the above-described optical integrated circuit as follows.

An n-GaAs (100)-oriented wafer (substrate 11) doped with Si to about $10^{18}$ cm$^{-3}$ was obtained from commercial sources. Then, in a single LPE cycle the following four layers were grown on the top major surface of wafer after suitable chemical cleaning: an n-$Al_{0.3}Ga_{0.7}As$ layer 12.1 about 2.4 μm thick and doped with Sn to about $10^{17}$ cm$^{-3}$; an n-$Al_{0.05}Ga_{0.95}As$ waveguide layer 12.2 about 1.0 μm thick and doped with Sn to about $5 \times 10^{16}$ cm$^{-3}$; an n-GaAs active layer about 0.5 μm thick and doped with Sn to about $10^{16}$ cm$^{-3}$; and a p-$Al_{0.6}Ga_{0.4}As$ cladding layer about 4.0 μm thick and doped with Ge to about $10^{17}$ cm$^{-3}$.

The wafer was then removed from the LPE apparatus and a Au layer was evaporated on the p-$Al_{0.6}Ga_{0.4}As$ layer and a Sn layer (electrode 28) was evaporated on the bottom major surface of the wafer. Standard photolithographic techniques were used to form rectangular resist patterns on the Au layer with lengths of 500 μm and 300 μm and widths between 140 μm and 35 μm. These resist rectangles defined the zones in which active devices (lasers and detectors) were to be located. Next, the unmasked portions of the Au layer were dissolved in a $I_2$-etch, specifically 113 gm KI, 65 gm $I_2$ and 100 cc $H_2O$. This step exposed the portions of the p-$Al_{0.6}Ga_{0.4}As$ layer located between active device locations and bifurcated the Au layer into separate electrodes 24 and 26. The exposed portions of the p-$Al_{0.6}Ga_{0.4}As$ layer were removed preferentially in HF, thereby exposing the underlying portions of the n-GaAs active layer and bifurcating the p-$Al_{0.6}Ga_{0.4}As$ layer into separate layers 18 and 22. Because HF is preferential, in that it attacks AlGaAs but not GaAs to any significant extent, HF etching automatically stops in the vertical direction when the n-GaAs layer is reached. In a similar fashion, the now exposed portions of the n-GaAs layer were preferentially etched in superoxol ($H_2O_2$ and $H_2O$ with a pH of about 7) which automatically stops at n-$Al_{0.05}Ga_{0.95}As$ layer 12.2, thereby bifurcating the n-GaAs active layer into the separate laser active region 16 and detector active region 20. The last step was to alloy the Au and Sn electrodes in flowing $H_2$ at about 500° C. At this point separate lasers 10 and detectors 14 are mesa units disposed on waveguide 12 as depicted in the figure. Actually the lasers and detectors are symmetric on the wafer and can be used interchangeably, although detectors used as lasers would be expected to have different longitudinal mode patterns and lasing thresholds.

We have found that the superoxol etchant tends to etch relatively slowly on As $\{\bar{1}11\}$ planes, so that the etched surfaces 16.1-16.2 and 20.1-20.2 are tilted in the direction of these planes. The lasers 10 were therefore oriented in the appropriate <110> cleavage direction so that the slope of the resulting etched mirrors would favor coupling into the underlying $Al_{0.05}Ga_{0.95}As$ passive waveguide layer 12.2. For example, with the lasers 10 oriented in the [1$\bar{1}$0] direction, As ($\bar{1}11$) and (1$\bar{1}$1) planes were exposed at the end surfaces 16.1-16.2 and 20.1-20.2, so that light would be reflected down, assisting the coupling into the $Al_{0.05}Ga_{0.95}As$ layer 12.2. In contrast, at 90° to this orientation, with the lasers in the [110] direction, the exposed As (11$\bar{1}$) and ($\bar{1}$11) planes reflect light up, reducing the performance of the circuit.

Devices were evaluated in the following fashion. I-V characteristics were measured to ensure proper diode behavior. One of the etched mirrors was removed from the longer (500 μm) mesa units by cleaving about 30 μm from the end of the cavity, as indicated by line 30 in the FIGURE. The laser 10 thus formed was pulsed (100 nsec pulses at a rate of 100 Hz) and the emission from the cleaved end 16.3 was used to determine in the conventional manner the lasing characteristics, such as the laser threshold current density $J_t$, longitudinal mode spacing, and $\eta_{cl}$, the differential quantum efficiency of radiation emitted through the cleaved facet. The 300 μm long mesa unit adjacent each 500 μm long laser unit served as an integrated detector 14 for light coupled into the passive $Al_{0.05}Ga_{0.95}As$ waveguide layer 12.2 as described below. This coupling results from two sources: the oblique orientation of surface 16.1, and the spread of the electric field from the GaAs active region 16 into the $Al_{0.05}Ga_{0.95}As$ layer 12.2 allowed by the small dielectric step at heterojunction 17. Some of the laser radiation in the cavity formed by cleaved surface 16.3 and etched mirror 16.1 is reflected by the etched mirror to provide the necessary optical feedback, but some also escapes from the laser cavity and is guided by the passive waveguide layer 12.2.

The effects of this coupling were evident from an optical micrograph of the top view, looking down on a portion of the wafer containing a laser and detector, photographed with Nomarski interference when the laser was pulsed above threshold. Infrared laser radiation was clearly visible along the etched mirror 16.1 of laser 10. Proof that the laser 10 was indeed lasing was provided by spectral measurements of the emitted radiation. Four strong longitudinal modes were observed, with a spacing nearly identical to that measured from a cleaved control laser (both mirrors cleaved) of approximately the same length. This modal structure proved that the cavity of laser 10 was terminated by the etched mirror 16.1.

Finally, several experiments were performed to measure the actual efficiency with which radiation could be transmitted to the detector via the passive waveguide. First, the laser 10 was pulsed with a known current, $I_L$, and the resulting short-circuit photocurrent $I_D$ was measured in detector 14. Induction-coupled current probes were used for both devices, and the data were repeated with probes interchanged. This measurement gave the over-all differential transfer efficiency $\eta_t = dI_D/dI_L$ for the integrated circuit and includes all sources of loss: radiation loss into air, divergence of the guided beam in the $Al_{0.05}Ga_{0.95}As$ layer 12.2, losses at the detector, etc. A differential quantum efficiency $\eta_t = 10 \pm 1\%$ was obtained. The threshold current density was $J_t = 6.5$ kA/cm$^2$. Second, the roles of laser and detector were reversed, so that the mesa unit with two etched mirrors (i.e., the original detector 14) was pulsed and operated as a laser. Values of $\eta_t = 2\%$ and $J_t \simeq 7.5$ kA/cm$^2$ were obtained. In comparing these efficiency results with conventional cleaved devices, it should be noted that only the output from one end of our circuit was being measured. Third, the efficiency of radiation observed from the cleaved facet of laser 10 was determined as $\eta_{cl} = 4\%$. Fourth, for comparison, measurements were made on a laser similar to laser 10, but with both mirrors cleaved (i.e., a conventional discrete laser) and the results were $\eta_{cl} = 16\% = 0.5 \, \eta_d$, where $\eta_d$ is the conventional differential quantum efficiency including output from both mirrors, and $J_t = 4.1$ kA/cm$^2$. In all these experiments, care was taken to ensure that the current measured by the detector was not due to electrical pickup.

These results are believed to be the first measurements of the transfer of energy between a semiconductor laser and detector via an extra-cavity waveguide integrated on one chip. The 10% differential transfer efficiency actually achieved is encouraging for integrated optical applications inasmuch as no attempts were made to optimize our circuit.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. Improvement of our circuit performance should be obtained by another masking and etching process to form 2-dimensional (mesa) waveguides between the lasers and detectors, and by optimization of layer thicknesses and composition.

What is claimed is:

1. An optical integrated circuit comprising
   a junction laser having an optical resonator and an active region disposed along the longitudinal axis thereof,
   a dielectric waveguide contiguous with a major surface of said active region, characterized in that
   at least one end of said resonator includes a surface which is oblique to said axis and which terminates at least one end of said active region, said surface being effective both to provide optical feedback to said active region and to couple laser radiation from said active region into said waveguide.

2. The circuit of claim 1 further including an optical detector having a light-sensitive active region contiguous with a localized portion of said waveguide, said light sensitive active region being terminated in at least one oblique surface effective to couple radiation from said waveguide into said light-sensitive region.

3. The circuit of claim 2 wherein said laser active region is terminated at one end, remote from said detector, in a surface substantially perpendicular to said axis and is terminated at its other end, nearest said detector, in said oblique surface.

4. An optical integrated circuit comprising
   a wide bandgap first cladding layer of one conductivity type,
   a narrower bandgap waveguide layer of said one type contiguous and substantially coextensive with said first layer,
   a still narrower bandgap laser active region disposed on and optically coupled to a localized portion of the free major surface of said waveguide layer,
   means forming an optical resonator which includes said active region along the longitudinal axis thereof, and
   a wide bandgap second cladding layer of the opposite conductivity type disposed on the free major surface of said active region, characterized in that
   said resonator forming means includes at least one surface which is oblique to said axis and which terminates at least one end of said active region, said surface being effective both to provide optical feedback to said active region and to couple laser radiation from said active region into said waveguide layer.

5. The circuit of claim 4 further including an optical detector which comprises a narrow bandgap detector active region disposed on and optically coupled to another localized portion of said free major surface of said waveguide layer and a wide bandgap third cladding layer of said opposite conductivity type disposed on the free major surface of said detector active region, said latter region being terminated in at least one oblique surface effective to couple radiation from said waveguide layer into said detector active region.

6. The circuit of claim 5 wherein said laser active region is terminated at one end, remote from said detector, in a surface substantially perpendicular to said axis and is terminated at its other end, nearest said detector, in said oblique surface.

7. The circuit of claim 6 wherein said layers comprise epitaxial Group III(a)-V(a) compounds, said free surfaces are (100) planes, said perpendicular surface is a cleaved (110) crystal facet and said oblique surface is an etched ($1\bar{1}1$) crystal facet.

8. The circuit of claim 7 wherein said layers comprise AlGaAs.

9. The circuit of claim 5 wherein both ends of said laser active region are terminated in surfaces which are oblique to said axis and symmetrically disposed with respect to a plane normal to said axis, said surfaces being effective both to provide optical feedback to said active region and to couple laser radiation from said active region into said waveguide layer.

10. An optical integrated circuit comprising
    a (100)-oriented $Al_xGa_{1-x}As$, $0<x\leq 1$ first cladding layer of one conductivity type,
    an $Al_yGa_{1-y}As$, $0<y<x\leq 1$, waveguide layer of said one type epitaxially grown on and substantially coextensive with said first layer,
    a GaAs active layer epitaxially grown on said waveguide layer,
    an $Al_rGa_{1-r}As$, $0<r\leq 1$, second cladding layer of the opposite conductivity type epitaxially grown on said active layer,
    a metal contact layer deposited on said second cladding layer, and
    separate lasers and detectors formed from said GaAs and $Al_rGa_{1-r}As$ layers as mesas oriented along the [$1\bar{1}0$] direction by the steps of:
      forming etch resistance rectangular masking layers oriented along the [$1\bar{1}0$] direction on said contact layer,
      subjecting the unmasked portions of said contact layer to a first etchant which does not attack said mask, but which etches said contact layer and said $Al_rGa_{1-r}As$ layer and stops etching when said GaAs layer is reached, thereby exposing portions of said GaAs layer,
      subjecting the exposed portions of said GaAs layer to a second etchant which does not attack said mask, but which etches said GaAs layer and stops etching when said $Al_yGa_{1-y}As$ layer is reached, thereby forming separated mesas of said GaAs, $Al_rGa_{1-r}As$ and contact layers on said $Al_yGa_{1-y}As$ layer,
      said second etchant being effective to form ($1\bar{1}1$) planes at the extremities of the remaining portion of said active layer under said mesas, and
      adjacent ones of said mesas along the [$1\bar{1}0$] direction defining a junction laser and an optical detector coupled to one another by said $Al_yGa_{1-y}As$ waveguide layer.

11. The circuit of claim 10 wherein said junction laser is cleaved along a ($1\bar{1}0$) plane so that one of the extremities of said active layer of said laser is a ($1\bar{1}0$) plane whereas the other is an ($1\bar{1}1$) plane.

* * * * *